(12) United States Patent
Wojnarowski et al.

(10) Patent No.: US 6,412,971 B1
(45) Date of Patent: Jul. 2, 2002

(54) LIGHT SOURCE INCLUDING AN ARRAY OF LIGHT EMITTING SEMICONDUCTOR DEVICES AND CONTROL METHOD

(75) Inventors: Robert John Wojnarowski, Ballston Lake; Barry Scott Whitmore, Waterford; William Paul Kornrumpf, Albany, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/258,935

(22) Filed: Mar. 1, 1999

Related U.S. Application Data

(60) Continuation-in-part of application No. 09/217,334, filed on Dec. 21, 1998, now Pat. No. 6,002,163, which is a division of application No. 09/002,314, filed on Jan. 2, 1998, now Pat. No. 5,888,884.

(51) Int. Cl.[7] .............................................. H01L 33/00
(52) U.S. Cl. ....................... 362/249; 362/252; 362/800; 313/500; 257/88
(58) Field of Search ................................ 362/249, 252, 362/800, 247; 257/88, 13, 81, 93; 313/500

(56) References Cited

U.S. PATENT DOCUMENTS

| | | | | |
|---|---|---|---|---|
| 3,716,907 A | * | 2/1973 | Anderson ................... 313/500 |
| 4,835,704 A | | 5/1989 | Eichelberger et al. ...... 364/490 |
| 4,845,405 A | * | 7/1989 | Yamane et al. ............. 313/500 |
| 4,930,216 A | | 6/1990 | Nelson ........................ 29/854 |
| 4,933,601 A | * | 6/1990 | Sagawa et al. ............. 313/500 |
| 4,984,358 A | | 1/1991 | Nelson ........................ 29/830 |
| 4,999,755 A | * | 3/1991 | Lin ............................. 362/800 |
| 5,162,878 A | * | 11/1992 | Sasagawa et al. .......... 362/800 |
| 5,300,788 A | * | 4/1994 | Fan et al. ...................... 257/13 |
| 5,353,498 A | | 10/1994 | Fillion et al. ................. 29/840 |
| 5,404,282 A | * | 4/1995 | Klinke et al. ................ 362/800 |
| 5,492,586 A | | 2/1996 | Gorczyca ..................... 156/245 |
| 5,497,033 A | | 3/1996 | Fillion et al. ................ 257/723 |
| 5,504,514 A | * | 4/1996 | Nelson ........................ 362/800 |
| 5,527,741 A | | 6/1996 | Cole et al. ................... 437/209 |
| 5,567,657 A | | 10/1996 | Wojnarowski et al. ...... 437/214 |
| 5,679,977 A | * | 10/1997 | Khandros et al. ........... 257/902 |
| 5,793,062 A | * | 8/1998 | Kish, Jr. et al. ............. 362/800 |
| 5,857,767 A | * | 1/1999 | Hochstein ................... 362/800 |
| 6,016,038 A | | 1/2000 | Mueller et al. | |
| 6,038,005 A | * | 3/2000 | Handschy ................... 362/800 |

OTHER PUBLICATIONS

Overton's Trailer Light Brochure, 111 Red Banks Road, PO Box 8228, Greenville, NC 27835.
Wojnarowski, allowed U.S. Application No. 09/002, 314, filed Jan. 2, 1998.
Srivastava et al., U.S. Application No. 09/203,212, filed Nov. 30, 1998.

* cited by examiner

*Primary Examiner*—Thomas M. Sember
(74) *Attorney, Agent, or Firm*—Ann M. Agosti; Jill M. Breedlove

(57) ABSTRACT

A light source includes a substrate; an array of un-packaged light emitting semiconductor devices (LESDs), each of the LESDs having at least one surface for emitting light and a substrate surface being attached to the substrate; and a plurality of electrical connections, each electrical connection coupled for providing electrical power to a respective LESD. The LESDs are arranged on the substrate with sufficient density and light generating capability to provide a predetermined irradiation from the light source.

24 Claims, 16 Drawing Sheets

LIGHT SOURCE INCLUDING AN ARRAY OF LIGHT EMITTING SEMICONDUCTOR DEVICES AND CONTROL METHOD

This Application is a Continuation-In-Part of Ser. No. 09/217,334 filed Dec. 21, 1998 now U.S. Pat. No. 6,002,163, which is a division of Ser. No. 09/002,314 filed Jan. 2, 1998 now U.S. Pat. No. 5,888,884. This application claims priority from U.S. Pat. Nos. 6,002,163 and 5,888,884.

BACKGROUND

The present invention relates generally to light sources. Conventional incandescent light bulbs have limited light efficiency. Conventional florescent light bulbs include mercury. Pre-packaged light emitting devices have been used in trailer lights commercially available from Overton's (Greenville, N.C.), for example, but the LED packaging presents density problems. There is a need for a light source that has long life and high efficiency and that does not create environmental concerns.

BRIEF SUMMARY OF THE INVENTION

Briefly, according to one embodiment of the invention, a light source includes a substrate; an array of un-packaged light emitting semiconductor devices (LESDs), each of the LESDs having at least one surface for emitting light and a substrate surface being attached to the substrate; and a plurality of electrical connections, each electrical connection coupled for providing electrical power to a respective LESD. The LESDs are arranged on the substrate with sufficient density and light generating capability to provide a predetermined irradiation from the light source.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
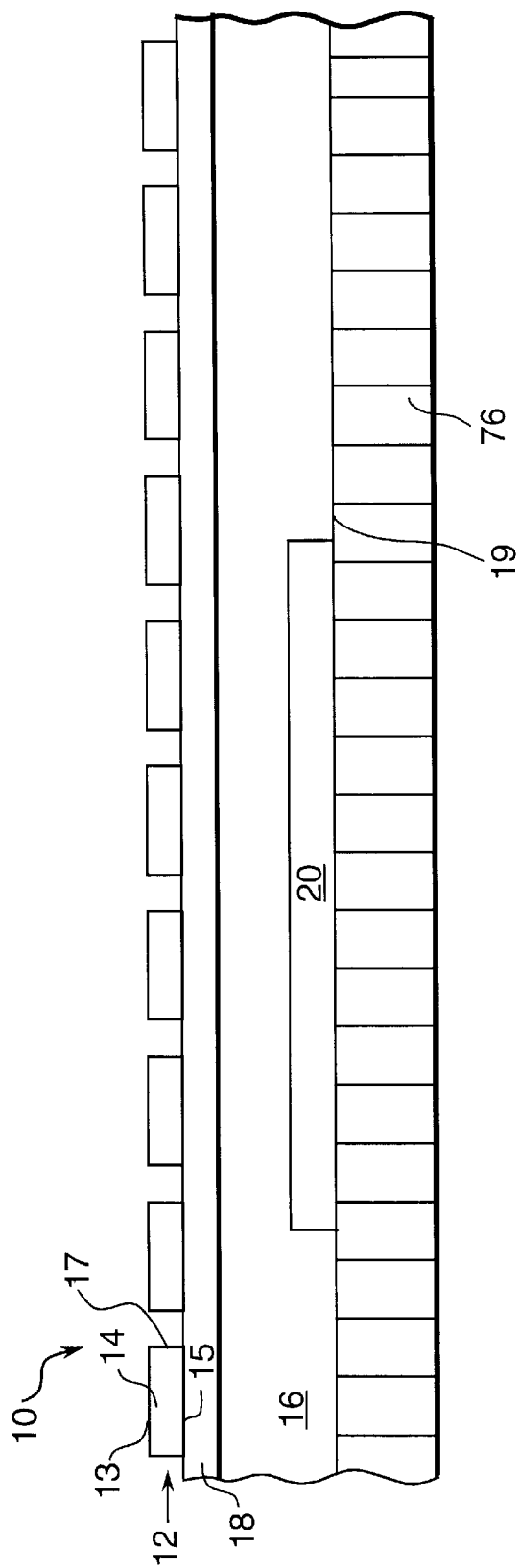
FIGS. 1 and 2 are side and top views of one embodiment of a of a light source of the present invention.
Figure 2:
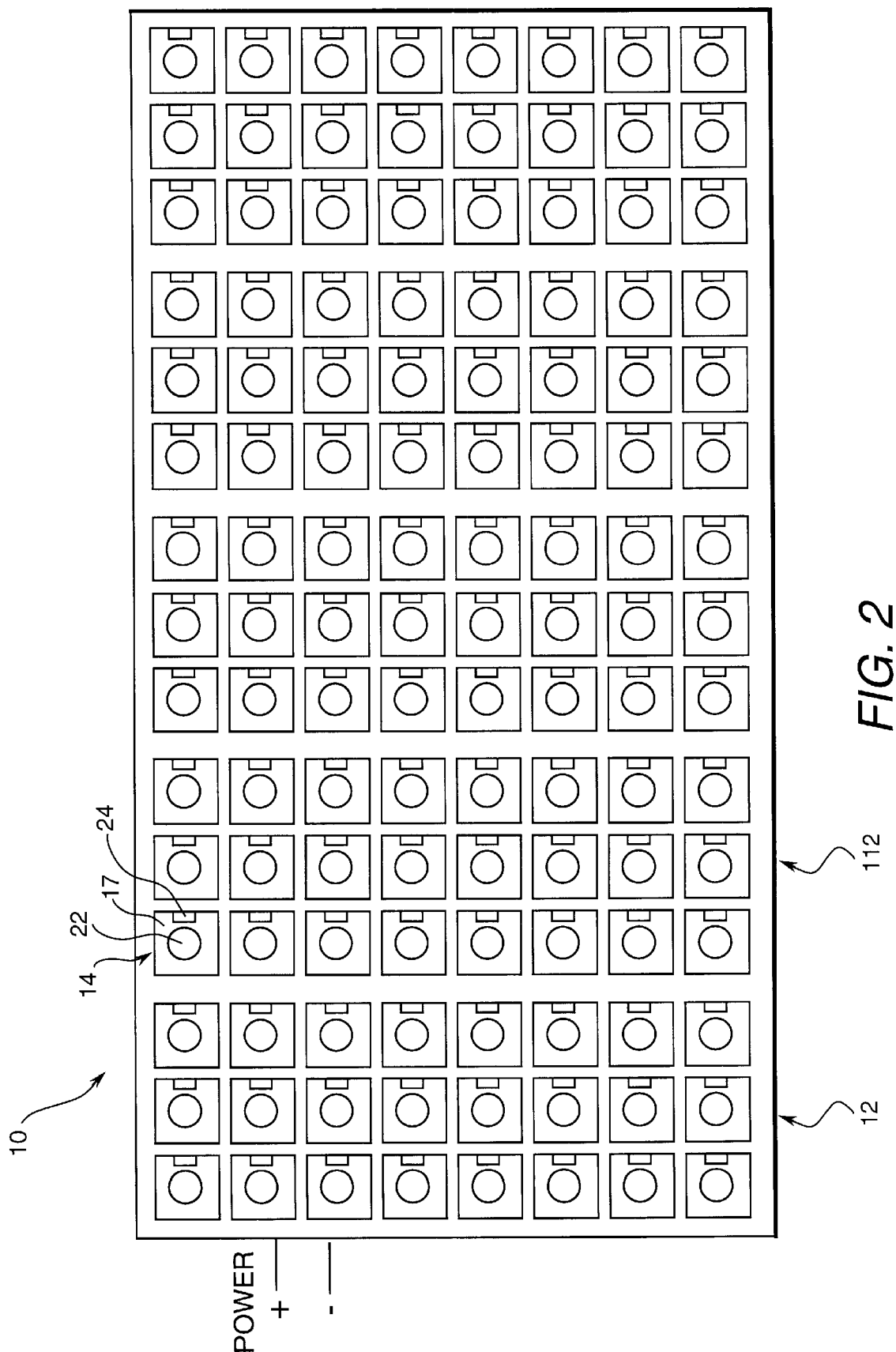

In FIGS. 1 and 2, one embodiment of the present invention is embodied in side and top views of a light source 10. In FIGS. 1 and 2 light source 10 includes a substrate 16 and an array 12 of unpackaged light emitting semiconductor devices (LESDs) 14. Each of the LESDs has at least one light emitting surface 13 and/or 17 for emitting light and a substrate surface 15 attached to the substrate. Each of a plurality of electrical connections 24 is coupled for providing electrical power to a respective LESD, and the LESDs are arranged on the substrate with sufficient density and light generating capability to provide a predetermined or selected irradiation from the light source.

Substrate 16 may comprise any suitable structural material such as a ceramic, a molded plastic material, a flexible interconnect structure, or a printed circuit board, for example. The substrate may comprise a flat substrate as shown in FIG. 1. As discussed further below, if desired, the substrate may comprise a curved, conformal, or flexible substrate. Substrate 16 may comprise or include a multilayer interconnect structure 18. More details on an embodiment for multilayer structure 18 are provided below with respect to FIG. 6.

LESDs 14 may comprise light emitting devices such as light emitting diodes (LEDs) or laser diodes, for example. Conventional LESDs can be used as well as new types of light emitting devices as such new types of light emitting devices are developed. The term "un-packaged" is meant to describe LESDs that are derived from the wafer state and may have some electrical connections 24 patterned thereon as described below with respect to FIGS. 3–7, for example. The un-packaged LESDs may either (a) each have a respective individual wafer or (b) be situated such that a single wafer includes multiple LESDs.

In the past, light colors for LEDs, in particular, were typically red, blue, yellow, or green. Recently, white LEDs have become commercially available. A useful light emitting device with a phosphor composition for providing white light is disclosed, for example, in commonly assigned Srivastava et al., U.S. application Ser. No. 09/203,212, filed Nov. 30, 1998. LESDs can be attached to the substrate by any of a number of techniques including, for example, adhesive (not shown) or solder (shown in FIG. 6).

LESDs are typically small in active light area. For example, active areas typically range from about 50 micrometers to about 100 micrometers. A number of LESDs (which varies according to the light source design and the desired light output) are positioned to produce a useful light output consistent with conventional light bulb technologies. As technology progresses and LESDs increase in light output capabilities, a smaller number of LESDs than at present will be needed to produce a comparable light power density.

Array 12 may comprise one or more arrays, shown in FIG. 2 as arrays 12 and 112, for example, which can be situated on a common substrate or situated in sub-modules on separate substrates. Applications for such arrays include, but are not limited to: ceiling lighting, back-lit liquid crystal display lap top computers, locomotive displays, photoresist exposure systems, television screens, wall sized light, photographic display arrays, as well as focused light sources such as head lights and flash lights, for example.

Figure 17:
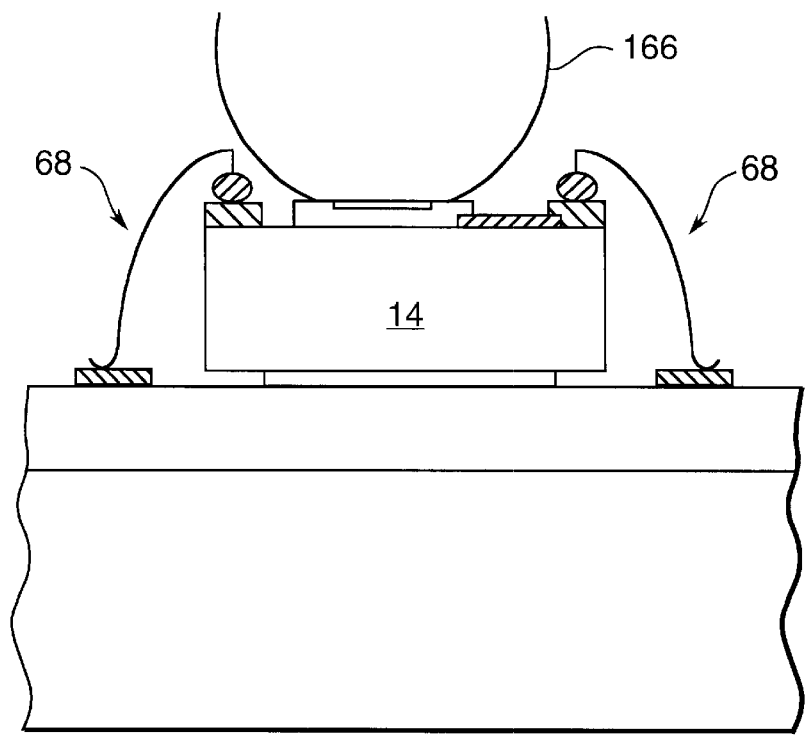

Electrical connections 24, shown in FIG. 2 as extending on side surface 17 of each LESD, are for purposes of example only. Wire bond connections 68 such as shown in FIG. 17 or other types of electrical connections such as solder bump techniques, can alternatively be used.

If LESDs 14 have substrate surface 15 (FIG. 1) contact pads (shown as pads 34 in FIG. 6, for example), the LESDs can be attached by solder, ball grid array, or micro ball grid array techniques (represented by element 54 in FIGS. 6 and 14) for example, for aiding in alignment of the LESDs. If the LESDs do not have metallization on substrate surfaces 15, then an adhesive such as a thermally conductive epoxy is useful for attachment purposes.

FIG. 1 additionally illustrates a control device 20 situated in substrate 16. The control device can be coupled to the LESD array by any appropriate connection technique. As discussed below with respect to FIGS. 24–26, this can be useful for controlling the operation of the LESDs.

Additionally, FIG. 1 illustrates a heat transfer device 76 which, in one embodiment as shown for purposes of example, is coupled to surface 19 of substrate 16 for optimizing thermal management of the array. In embodiments wherein a heat transfer device is used, a thermally conductive substrate such as sapphire, aluminum nitride, aluminum silicon carbide, diamond, or thermally conductive ceramic blends, for example, is useful. Cooling becomes important as the density and intensity of the emitted light increases. The heat transfer device may comprise a heat sink or a coolant assembly, for example. In one embodiment, the heat transfer device comprises a heat sink material such as aluminum silicon carbide, aluminum, aluminum nitride, or beryllium oxide. In another embodiment, thermoelectric cooling can be used. In still another embodiment, copper foil interconnections (not shown) can be used to route heat away from the LESDs. Another technique for thermal cooling is to selectively control lighting output of different LESDs of the light source. An associated control system is discussed with respect to FIGS. 24–26.

Figure 7:
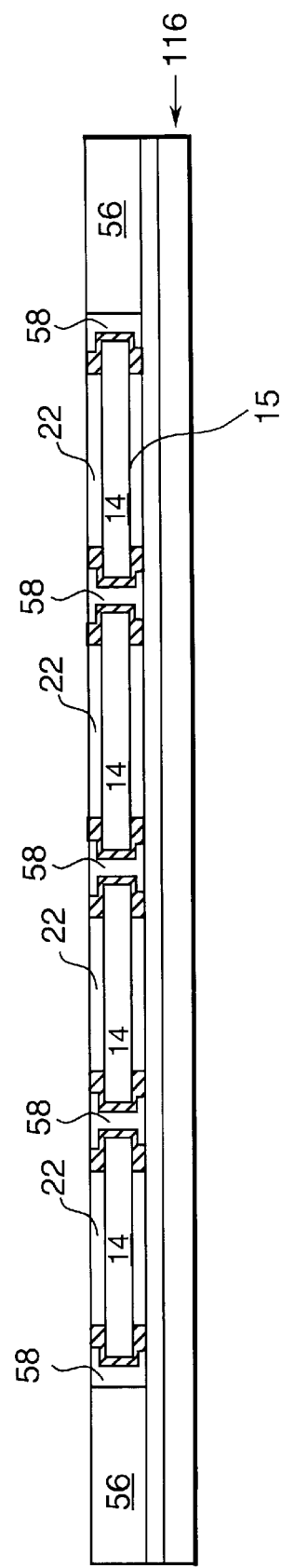
FIGS. 5–7 are side views of different embodiments of LESDs for use in the embodiments of FIGS. 1 and 2.
Figure 3:
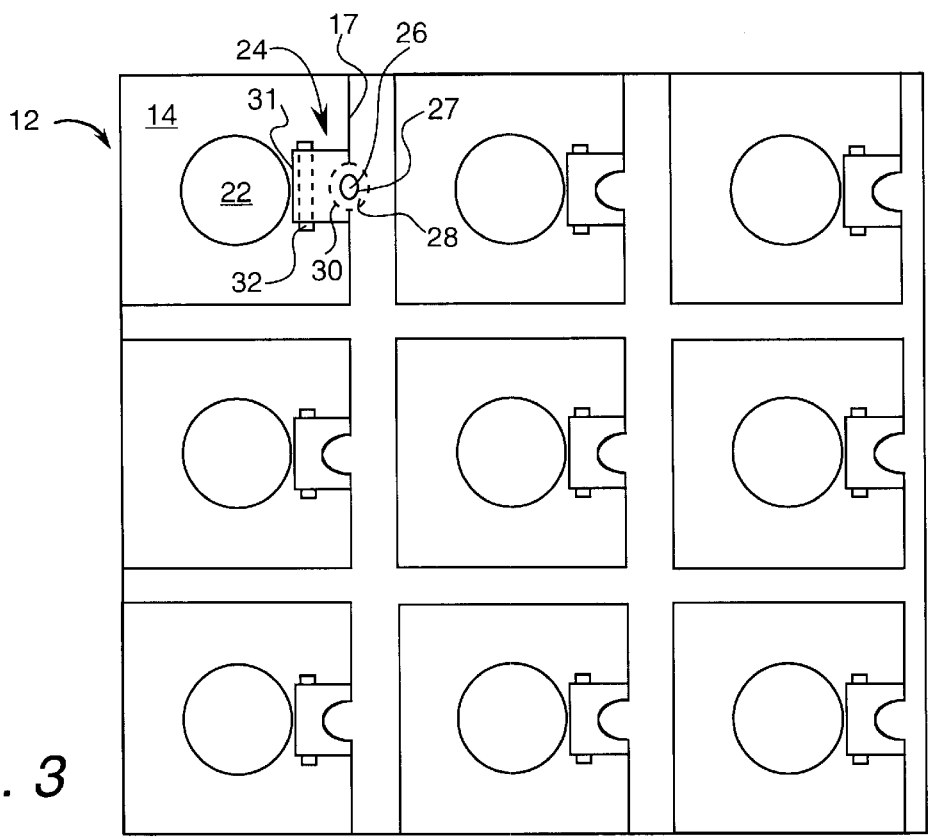
FIGS. 3 and 4 are top and bottom views of different embodiments of light emitting semiconductor devices (LESDs) for use in the embodiments of FIGS. 1 and 2.
Figure 4:
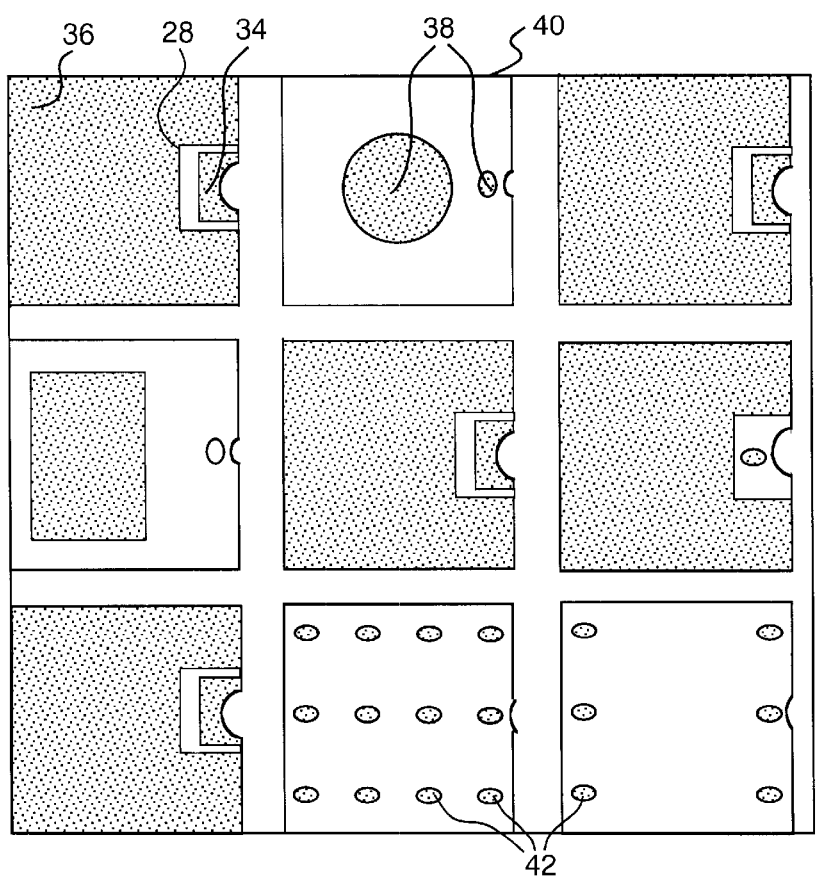
Figure 5:
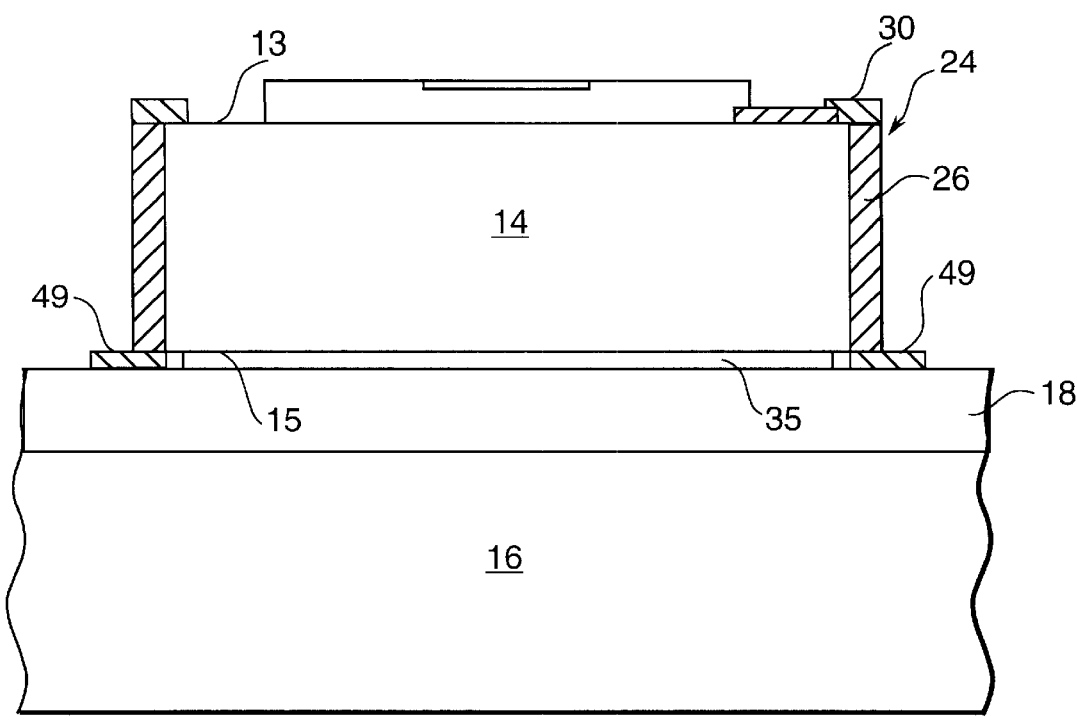
Figure 6:
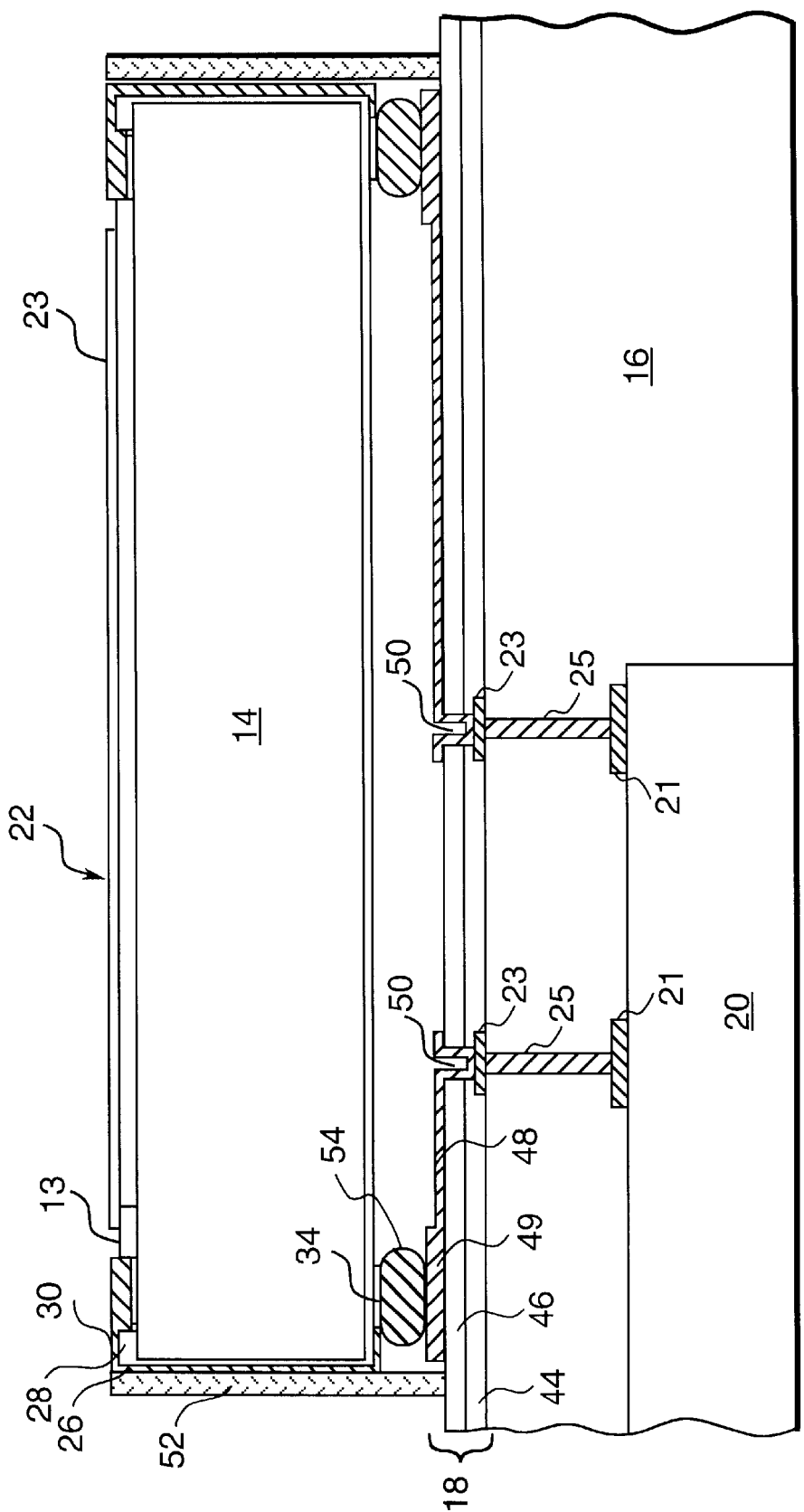

FIGS. 3 and 4 are top and bottom views and FIGS. 5–7 are side views of different embodiments of LESDs for use in the embodiments of FIGS. 1 and 2. In these embodiments, each electrical connection 24 includes metallization 26 patterned over a portion of at least one side surface 17 of a respective LESD 14. These embodiments are useful because surfaces 13 of LESDs 14 are not encumbered and allow easy application of optional phosphors, reradiative components or reflector components (shown in FIGS. 10–20). Furthermore, in these embodiments, light emissions are not blocked by wire bonds.

Electrical connections 24 can be fabricated in a similar manner as disclosed in commonly assigned Wojnarowski, now U.S. Pat. No. 5,888,884 U.S. application Ser. No. 09/002,314, filed Jan. 2, 1998, where, in one embodiment, a semiconductor wafer includes a plurality of device active regions 22 separated by scribe lanes. Holes 30 are formed through the wafer within the scribe lanes. To prevent electrical short circuits, an electrically insulating layer 28 is formed over all exposed surfaces of the wafer, front and back, including within the holes, and openings 27 are made in the insulating layer for access to top interconnection pads 32. The wafer and holes are metallized and patterned to form bottom interconnection pads (in FIG. 4 shown as 34, 38, and 42) on a bottom (substrate) surface electrically connected to corresponding top interconnection pads by metallization 26 extending within the holes and metallization 31 on an active (first) surface of the wafer. Finally, a dicing saw is employed having a kerf width less than the diameter of the holes to separate the individual devices. Since the saw kerf width is less than the hole diameter, at each hole location a portion of the metallized hole remains on each side of the cut, forming electrically conductive channels on the device edges extending top to bottom. This technique results in LESDs that can be positioned substantially edge-to-edge.

Although the above paragraph describes one example of a method for forming electrical connections, other embodiments can be used in the present invention. For example, if metallization 31 is appropriately plated over the top surface, it is not necessary that an LESD have a first surface interconnection pad 32. In another embodiment, a connection could be made through an insulated and metallized through hole situated within the device (preferably not on a location overlapping the active area) rather than on a sidewall. Contact pads on the bottom surfaces of the LESDs may be preformed or formed by the above discussed metallization process and may comprise any desired form.

Depending on the device, an input/output, bias, or cooling pad 35, shown in FIG. 5 may additionally be present or patterned on substrate surface 15 of an LESD. FIG. 5 additionally illustrates an embodiment wherein rather than having metallization 26 extend to or form bottom contact pads, metallization 26 has a sufficient area to be electrically coupled to substrate contact pads 49.

In one embodiment of the present invention, as shown in FIG. 6, substrate surface 15 of each LESD includes at least one substrate surface contact pad 34 and the substrate includes substrate contact pads 49, wherein metallization 26 extends to the at least one substrate surface contact pad, and wherein the at least one substrate surface contact pad is aligned with at least one of the substrate contact pads. Substrate surface contact 34 may comprise a portion of metallization 26 or a separate contact pad to which metallization 26 is electrically coupled. FIG. 6 additionally illustrates an optional phosphor coating 23 which can be applied as disclosed in aforementioned Srivastava et al., U.S. application Ser. No. 09/203,212.

FIG. 6 additionally illustrates the use of alignment pins 52 for LESD 14 and a multilayer interconnect structure 18. As discussed in aforementioned Wojnarowski, U.S. application Ser. No. 09/002,314, now U.S. Pat. No. 5,888,884 alignment pins can be used to properly align devices. In one embodiment, multilayer interconnect structure comprises a high density interconnect structure which is useful for coupling substrate surface contact pads 34 to device contact pads 21 of control device 20. In one embodiment control device 20 can by coupled to surface pads 23 by electrically conductive through posts 25, for example. Solder, electrically conductive epoxy, or ball grid array material 54 is used in one embodiment to couple substrate contact pads 34 and substrate contact pads 49. Multilayer interconnect structure 18, in one embodiment comprises a dielectric layer 46 such as a polymer attached to substrate 16 with an adhesive 44 and having openings 50 extending to surface pads 23. Patterned metallization 48 then is formed and patterned to extend to surface pads 23 and form the substrate contact pads 49. Techniques for applying dielectric layers, forming openings, and applying and patterning metallization are described, for example, in Eichelberger et al., U.S. Pat. No. 4,835,704.

FIG. 7 illustrates an embodiment wherein the substrate on which substrate surfaces 15 of LESDs 14 rest is itself a multilayer interconnect structure 116 which may comprise layers of dielectric material and metallization. This embodiment is useful for reducing potential stresses that can result from differing substrate and LESD coefficients of thermal expansion. If more structural support is desired, molding material 58 can be formed around LESDs 14 with an optional mold frame 56. Molding techniques and techniques for coupling multilayer structures to electronic devices are described in Fillion et al., U.S. Pat. No. 5,353,498, Gorczyca, U.S. Pat. No. 5,492,586, Cole et al., U.S. Pat. No. 5,527,741, and Wojnarowski et al., U.S. Pat. No. 5,567,657, for example.

Figure 8:
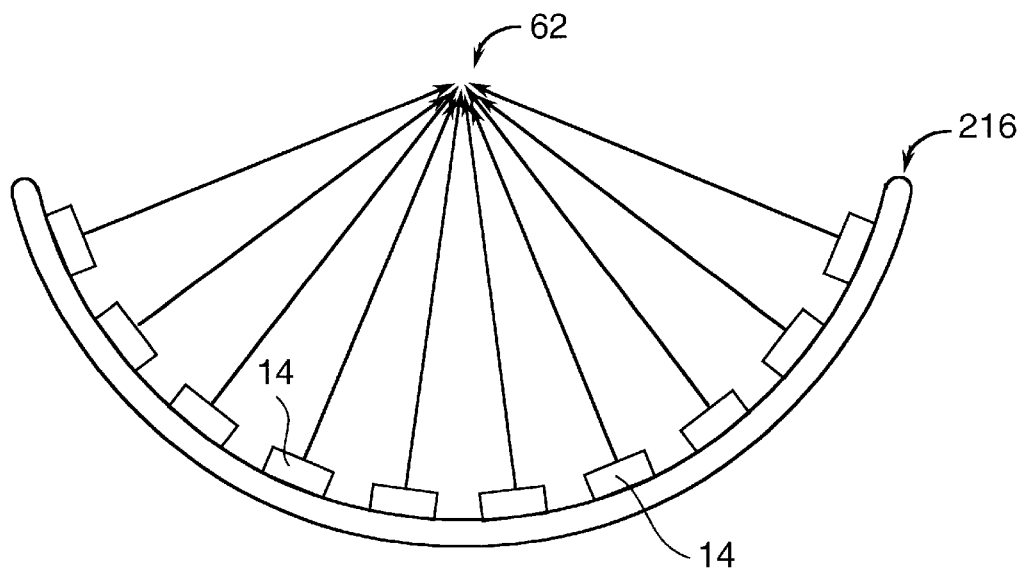
FIGS. 8 and 9 are side views showing embodiments of the present invention wherein a flexible or curved substrate is included.
Figure 9:
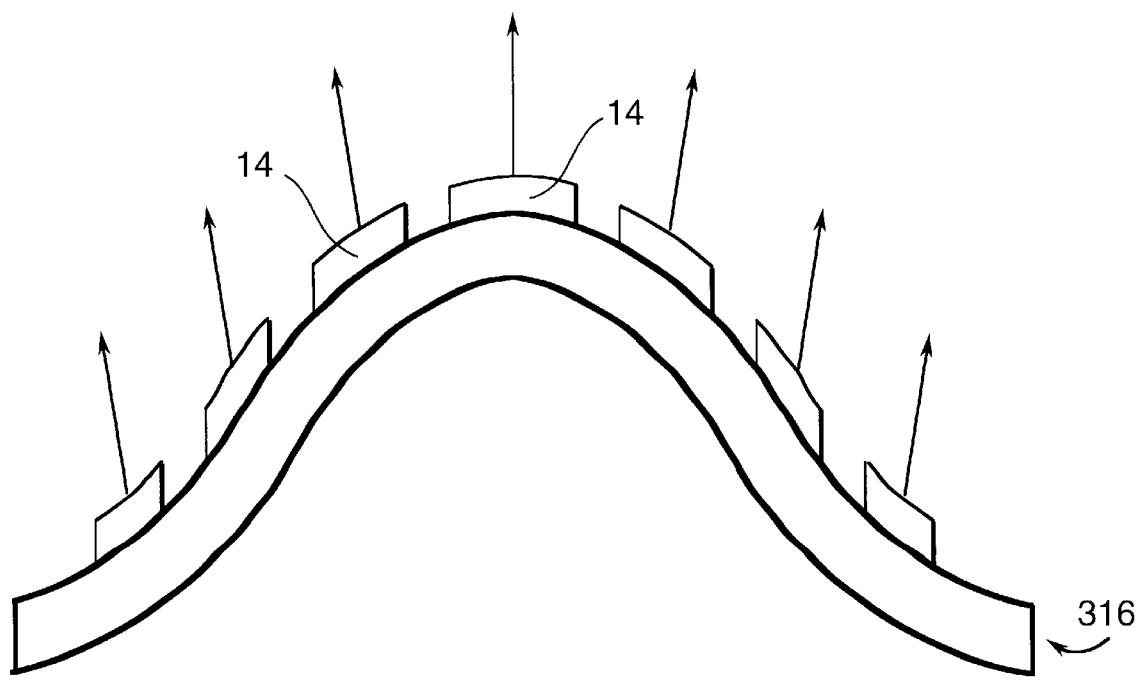

FIGS. 8 and 9 are side views showing embodiments of the present invention wherein a flexible and/or curved substrate 216, 316 is included. The term "flexible" is intended to encompass substrates that are capable of being bent under normal conditions or substrates that can have their shapes altered by processes such as heat forming. In some situations, bending is facilitated by bonding or conforming a substrate to a curved surface (not shown). The degree of flexibility will depend on the material properties and the thickness of the substrate (which can be reduced by techniques such as grinding, for example) and, to a limited extent, on the properties of LESDs 14. Flexible substrates are useful for providing light sources according to the present invention that are conformal to airplane cockpits and automobile dashboards, for example.

In the embodiments of FIGS. 8 and 9, substrates 216 and 316 have curved shapes and the arrays of LESDs form a curved arrays. In FIG. 8 the curved shape of substrate 216 creates a convergent light pattern focusing to point 62, whereas in FIG. 9 the curved shape creates a divergent light pattern. Such patterns can be useful for directing light to desired locations. For example, convergent light is useful for a solid state flashlight or headlight.

FIGS. 10–13 are side views of different embodiments of reradiative components 64, 78, 80, and 86 for use with the present invention. The optional use of reradiative components and/or reflector components (shown in FIGS. 14–20) cost-effectively minimizes misdirected light that can be emitted from tops and sides of LESDs.

Figure 10:
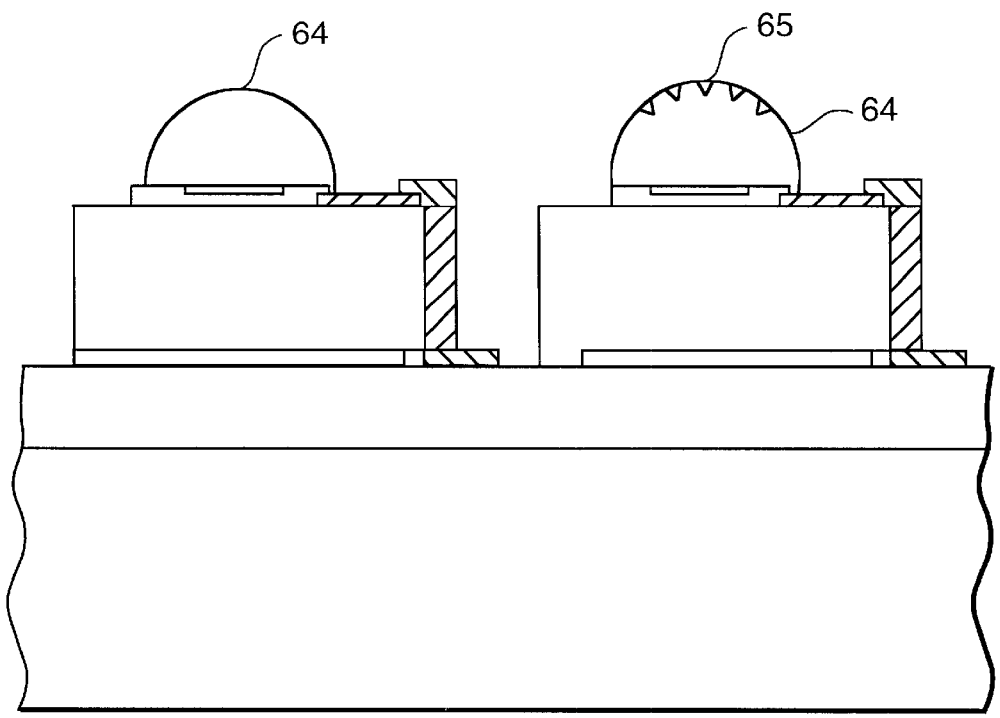
FIGS. 10–13 are side views of different embodiments of reradiative components for use with the present invention.

In one embodiment, as shown in FIG. 10, the reradiative component comprises a plurality of lenses 64 with each lens being situated over a respective one of the LESDs. In one embodiment, lenses 64 are attached by a bonding glue (not shown), for example. In another embodiment, a droplet of a liquid lensing material can be deposited on each LESD which, when dried, forms a natural curvature lens due to surface tension or properties of the material. Solid lensing material can alternatively be placed on the die and heat reflowed and melted into shape. A laser or other cutting or etching device can be used to form one or more cuts or otherwise create one or more specific patterns 65 in the lenses to aid in focusing and light distribution control.

Figure 11:
Figure 12:
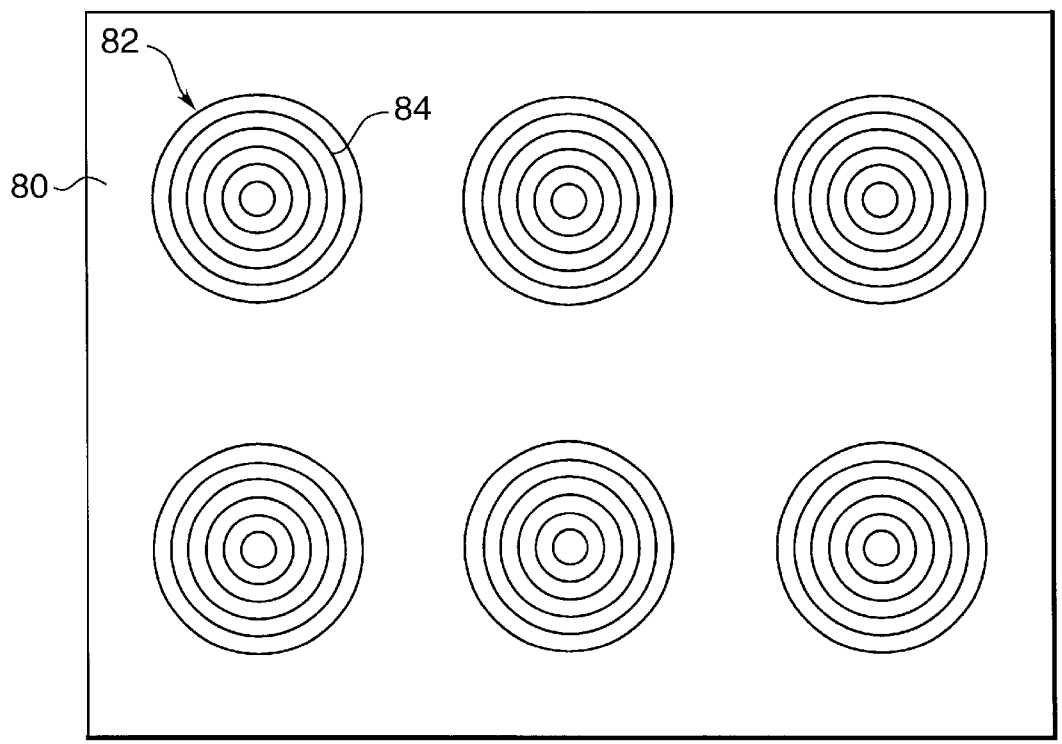
Figure 13:

In another embodiment, as shown in FIGS. 11–13, the reradiative component comprises a reradiative panel 78, 80, or 86. In the embodiment of FIG. 11, the reradiative panel comprises a flat plate 78 that can be tinted to create a change in color of light emitted from LESDs 14, for example. In one embodiment the flat plate comprises quartz, polymethylmethacrylate (PMMA), or polyetherimide, for example, coated on either side by phosphors or layers of phosphors to provide a specific colored light. In the embodiments of FIGS. 12 and 13, the reradiative panel comprises a patterned sheet 80 or 86. Sheet 80 includes areas 82 including etched lines 84 which form focusing patterns for respective LESDs and operate in a similar manner as Frenel lenses. Patterned sheet 86 includes teeth portions 88 to aid in focusing. The reradiative panels can be placed adjacent or spaced apart from the LESDs. For patterned sheets, the patterned portion can be facing towards or away from the LESDs and may have optional phosphor layers patterned on either surface.

Any of the above discussed reradiative components may be tinted or otherwise adapted to change the color of the light emitted by the LESDs. For example, the reradiative components can change infrared light to visible light or visa versa by the use of dyes or phosphors.

FIGS. 14–20 and 27 are views of different embodiments of optional reflector components 66 or 166 for use with the present invention with each reflector component being situated to reflect light from a respective one of the LESDs 14. The reflector components are shaped to re-direct the maximum light emitted at odd angles from the LESDs so that such light is not lost and can be effectively used. Reflector components can be used with or without reradiative panels. Although the reflector components are shown as parabolic for purposes of example, other optimized reflector component shapes can alternatively be used. As one example, using a stepped profile or a geometric profile can aide in forming a specific pattern of light.

Figure 14:
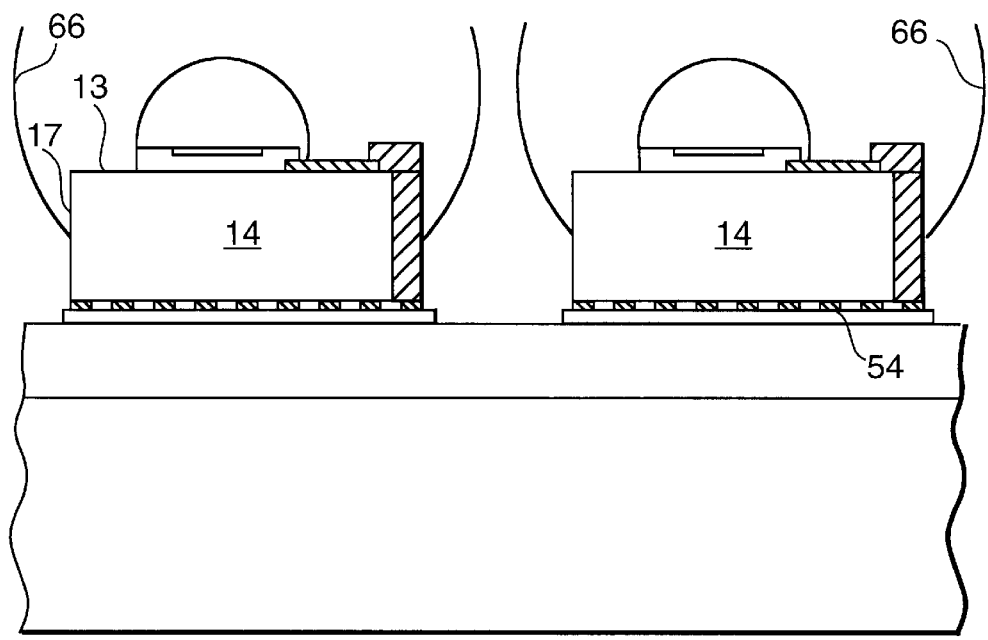
FIGS. 14–20 are views of different embodiments of reflector components for use with the present invention.
Figure 15:
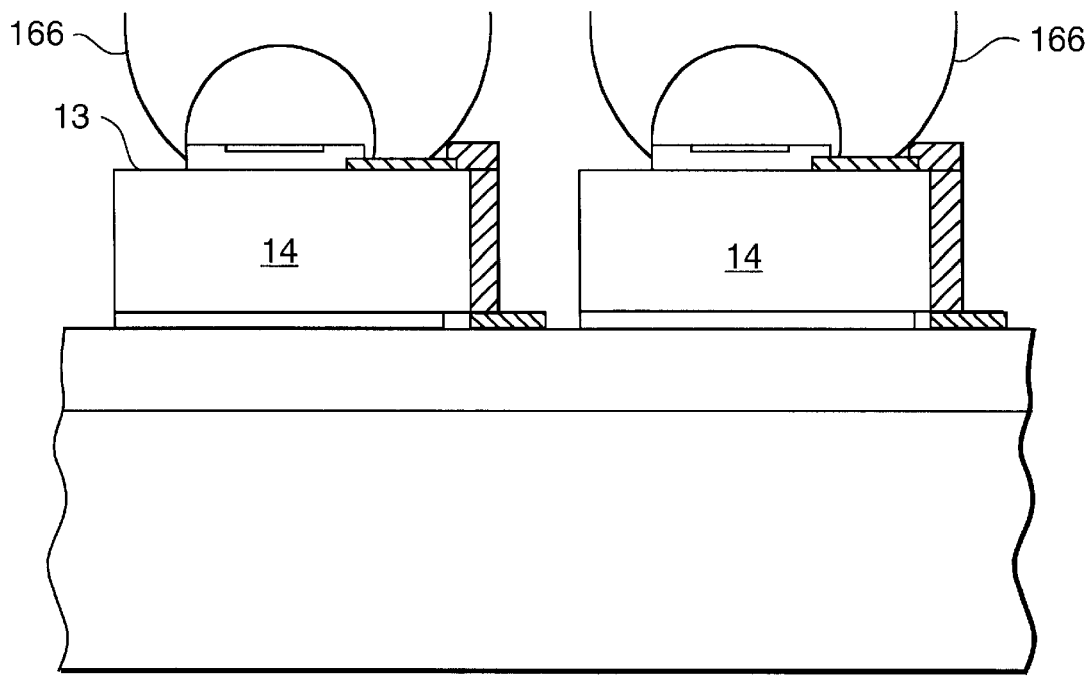

In one embodiment, as shown in FIGS. 14 and 15, a plurality of reflector components 66 and 166 are situated to reflect light from a respective one of the LESDs 14. Although there can be one reflector per LESD in one embodiment, in other embodiments, some LESDs have reflector components whereas other LESDs do not and/or some LEDs share a common reflector component. These reflector components can be useful for the LESD density for large area panel or wall or ceiling lighting technologies. As shown in FIGS. 14 and 15, the specific positioning of the reflector components is not critical. In FIG. 14 reflector components 66 extend to sides of the LESDs, whereas in FIG. 15 reflector components 166 extend to surfaces 13 of the LESDs. For LESDs that emit light form side surfaces 17 in addition to or instead of top surfaces 13, it is useful to have a reflector component which reflects and does not block such side emitted light.

Figure 16:
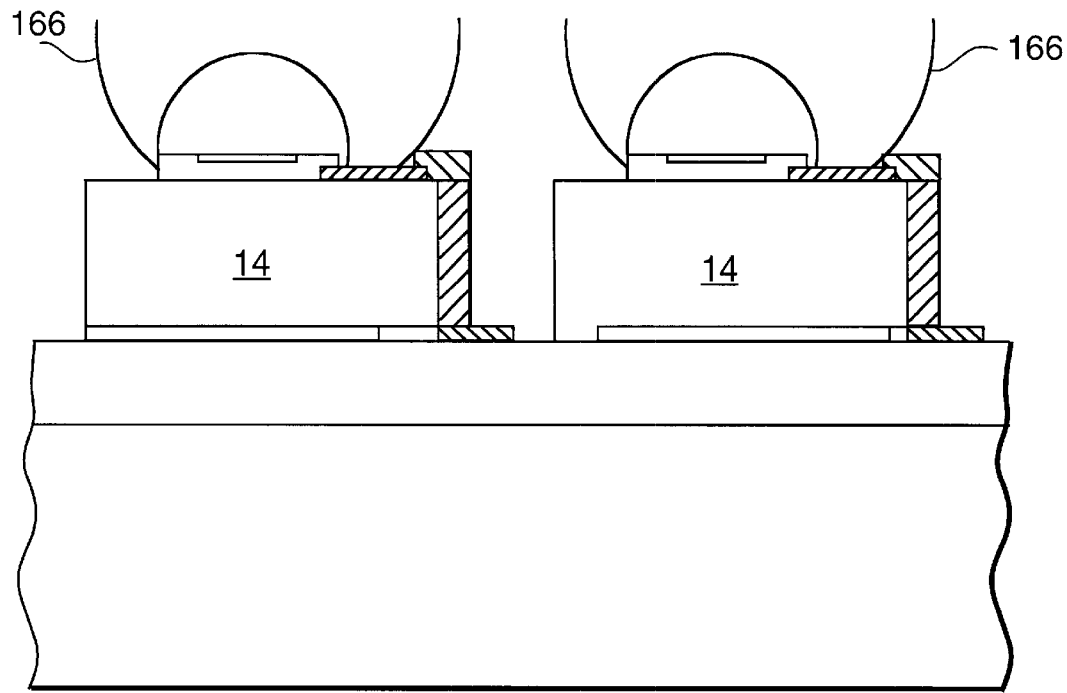

FIGS. 16 and 17 illustrate embodiments wherein the reflector components 166 are used without reradiative components. FIG. 17 further illustrates an embodiment wherein electrical connections 68 are used to provide electrical power to a respective LESD 14 comprises wire bonds. Wire bonds, although not providing the advantage of edge to edge placement of LESDs and limiting some types of applications of reflector components and reradiative components, may provide sufficient light in some applications, particularly with the use of reradiative components and/or reflector components.

Figure 18:
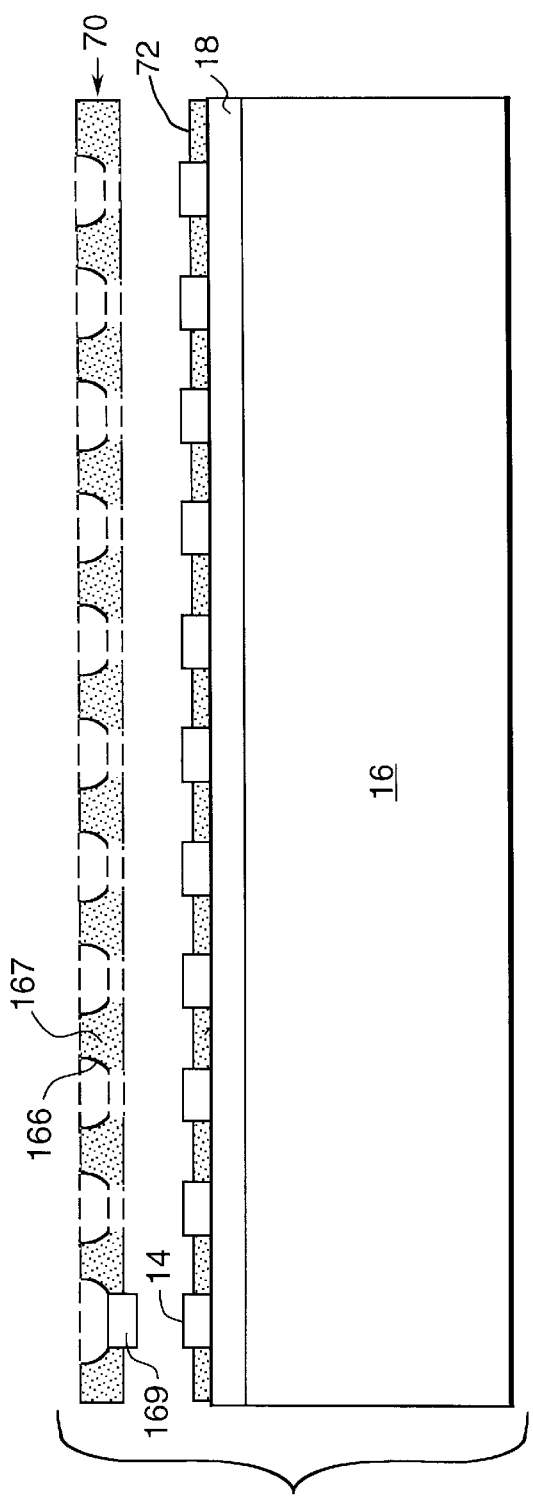
Figure 19:
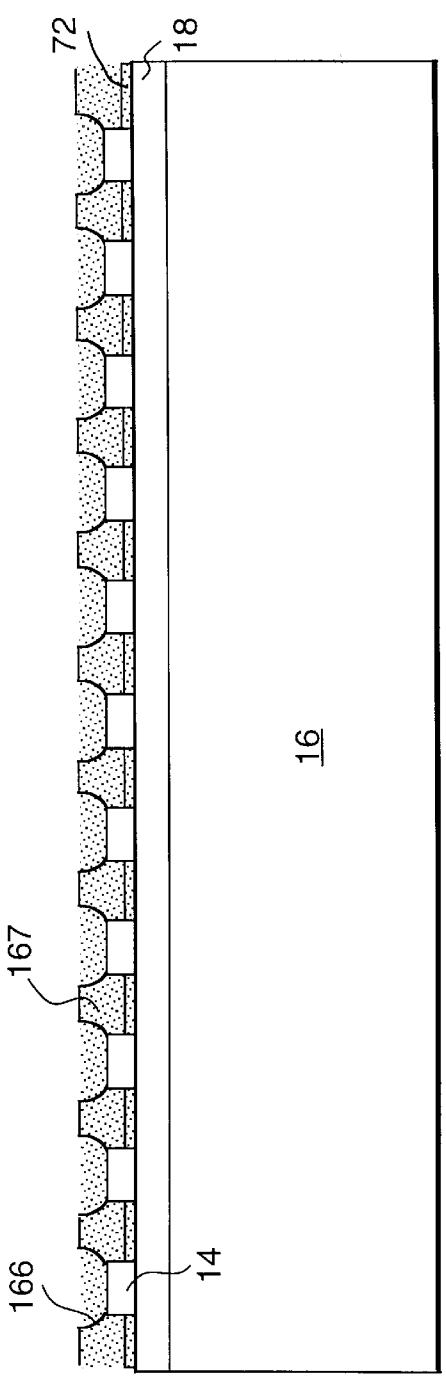
Figure 20:
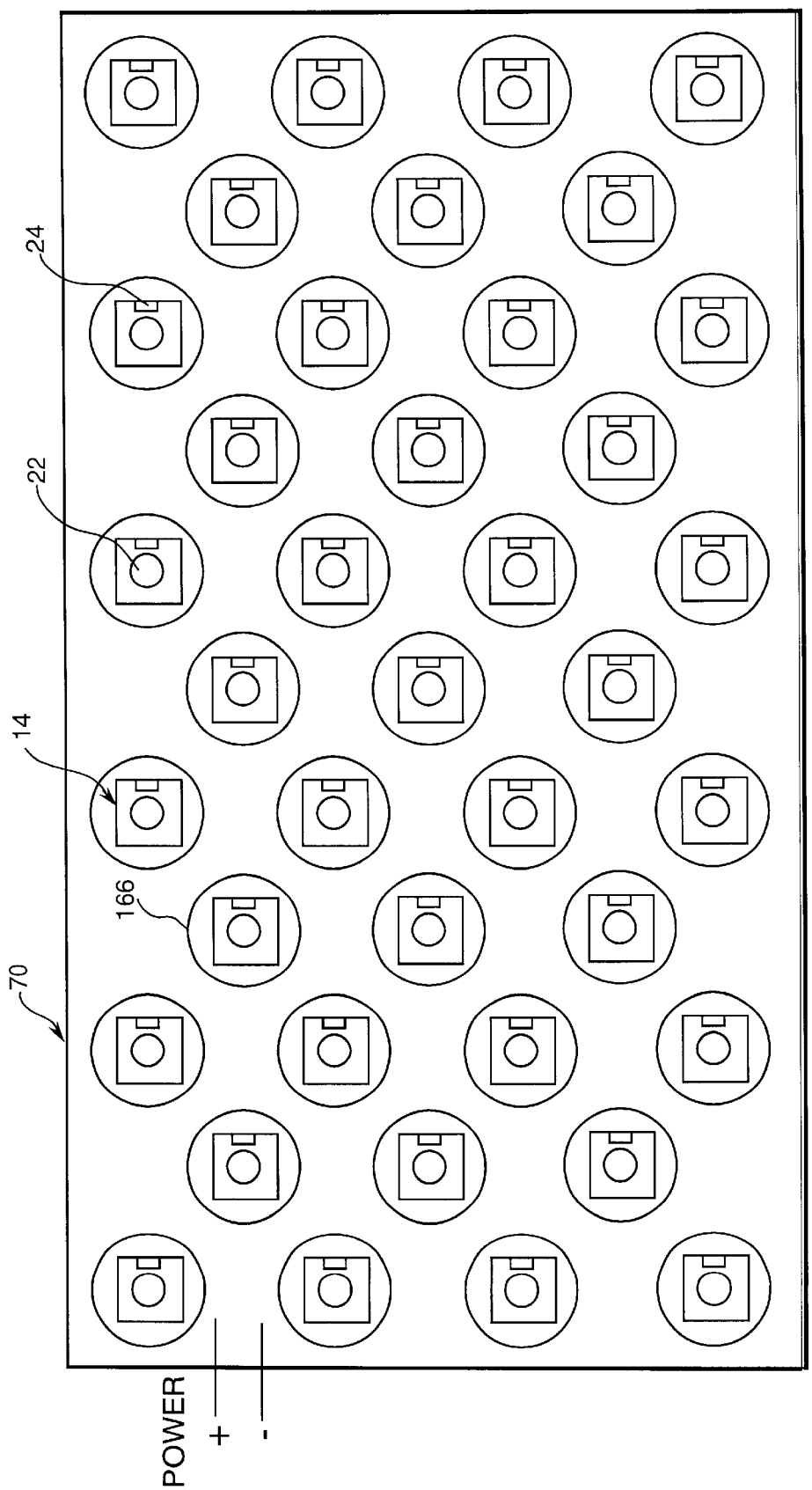

In the embodiments of FIGS. 18–20, the plurality of reflector components comprise an integral reflector component assembly 70 having reflector portions 166. This embodiment is useful because the reflector components can be positioned simultaneously. In one embodiment, a layer of adhesive 72 comprising a material such as epoxy, polyethylene, or polytetrafluoroethylene, for example, can be applied to the surfaces of substrate 16 or multilayer interconnection structure 18 if such structure forms part of substrate 16, and the reflector component assembly can be affixed to the adhesive.

In one embodiment the reflector component assembly is fabricated by injection molding a plastic material and coating the injection molded material 167 with reflector portions 166 comprising reflective material. Preferably injection molded material 167 comprises a material that can be molded to result in a smooth surface. Useful materials, for example, include polytetrafluoroethylene, epoxy, or polyester, for example. The injection molded material may further comprise optional filler material such as glass or ceramic particles, for example. After injection molding, reflector portions 166 can be applied over the surfaces. In one embodiment, reflector portions 166 comprise an adhesion promoting material such as titanium covered by a reflective material such as aluminum or gold, for example. To prevent the reflective coating from extending to the substrate or along side surfaces of LESDs 14, spacers (one spacer 169 which is shown in FIG. 18 for purposes of example) can be used during the application of the reflective coating).

Figure 27:
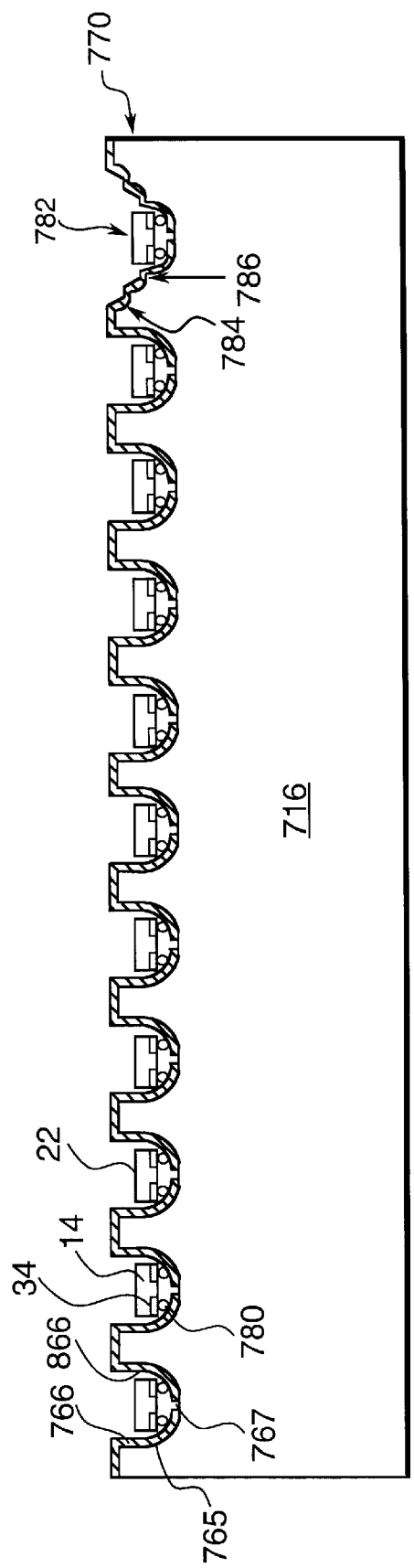
FIG. 27 is a side view of another reflector component embodiment for use with the present invention.

FIG. 27 is a side view of another reflector component embodiment for use with the present invention. In this embodiment substrate 716 includes reflector component assembly 770 either as an integral or pre–attached assembly. Reflector portions 766 can be formed as discussed above with respect to reflector portions 166. LESDs 14 are then attached to the substrate/reflector component assembly combination.

In one embodiment, as shown in FIG. 27, the LESDs 14 have non active area chip pads 34, and reflector portions 766 and 866 serve both as light reflectors and as electrical couplers for coupling the LESDs. In this embodiment, area 767 of curved surface 765 is not coated with reflective material (the reflective material can be blanketdeposited and then removed from areas 767 by etching), and the chip pads are coupled to reflector portions 766 and 866 with a bond 780 comprising solder or a conductive adhesive, for example. FIG. 27 additionally shows a reflector component 782 which has stepped portions 784 and angled portions 786. Combinations of reflector components (which may have different profiles from steps, angles, and/or curves, for example, than adjacent reflector components) can be used to form virtually any desired light energy distribution (irradiance).

Figure 21:
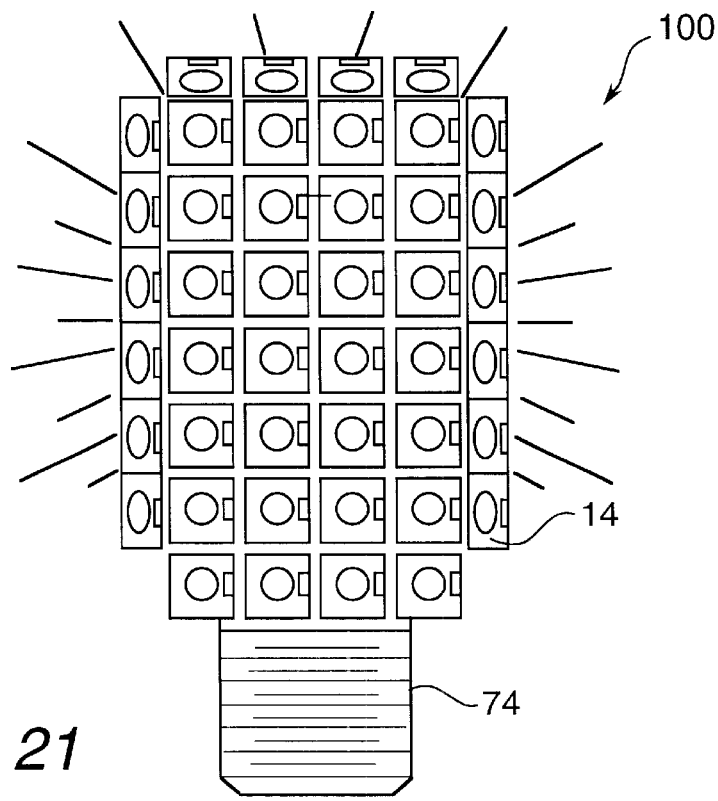
FIG. 21 is a view of one embodiment of the present invention wherein the light source is in the shape of a conventional incandescent light bulb.

FIG. 21 is a view of one embodiment of the present invention wherein light source 100 has a light-bulb-shaped substrate and further includes a conventional base 74 for insertion into a residential 120 volt socket (not shown).

Figure 22:
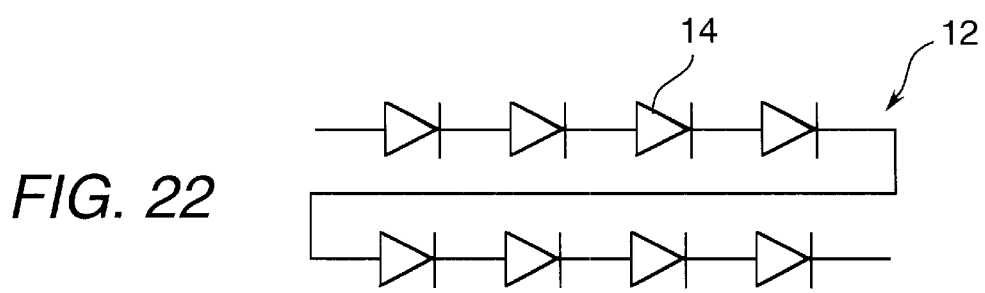
FIGS. 22 and 23 are circuit diagrams of example LESD array interconnections.
Figure 23:
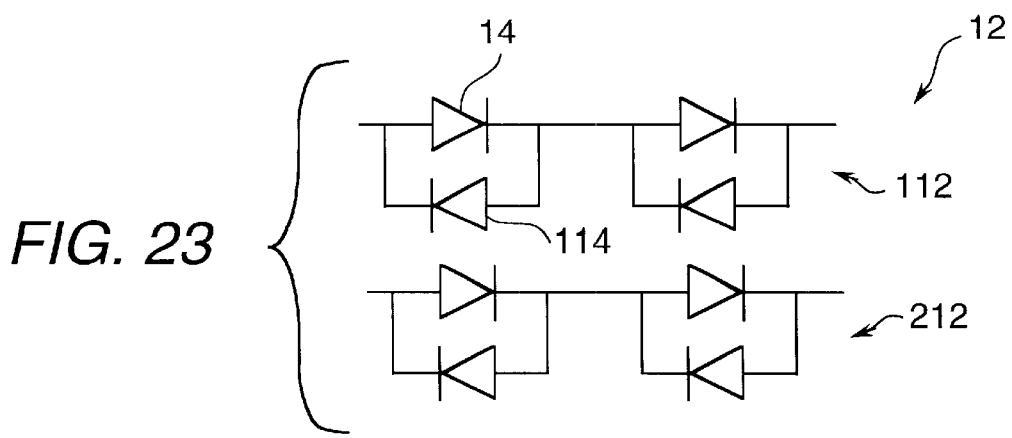

FIGS. 22 and 23 are circuit diagrams of example LESD array interconnections. In FIG. 22, each of LESDs 14 of array 12 is coupled in series orientation. Series orientation is the simplest form of interconnection. In FIG. 23, the LESDs 14 and 114 are arranged in parallel pairs with reverse parallel orientations. The pairs of LESD array 12 can be coupled to each other pair or separated into sub-arrays 112 and 212, for example. Sub-arrays can additionally be used for the series orientation couplings of FIG. 22.

Figure 24:
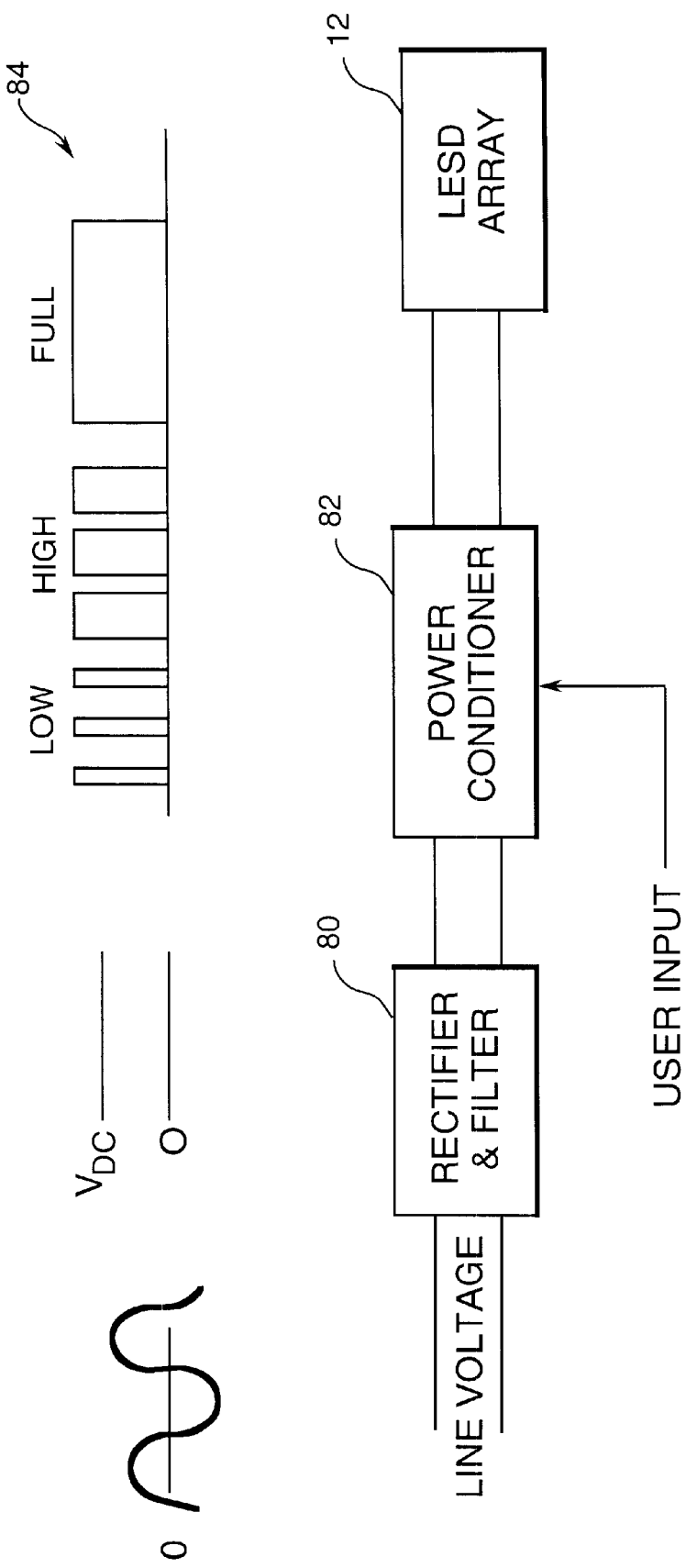
FIGS. 24–26 are simplified block diagrams of example control systems for use with the present invention.
Figure 25:
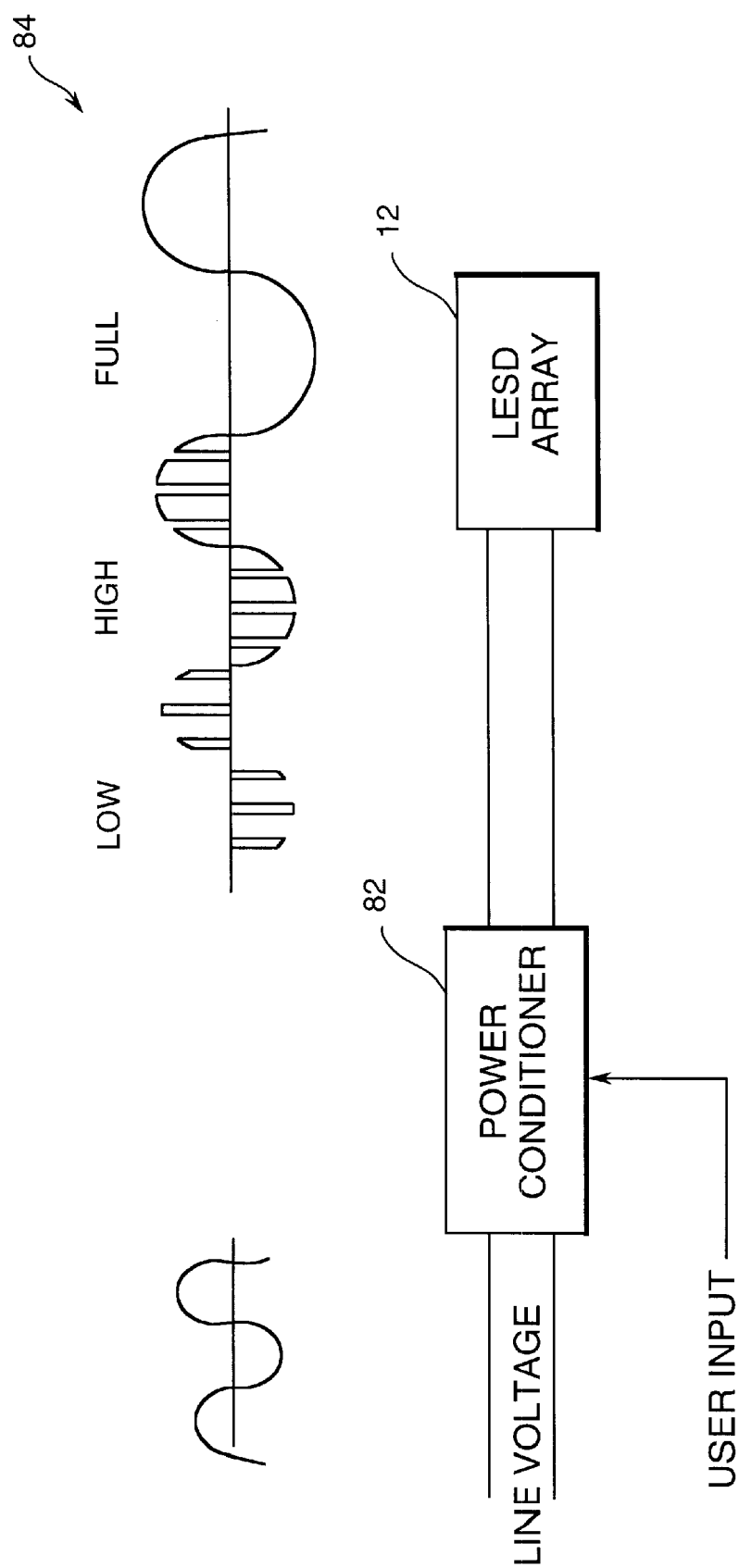
Figure 26:
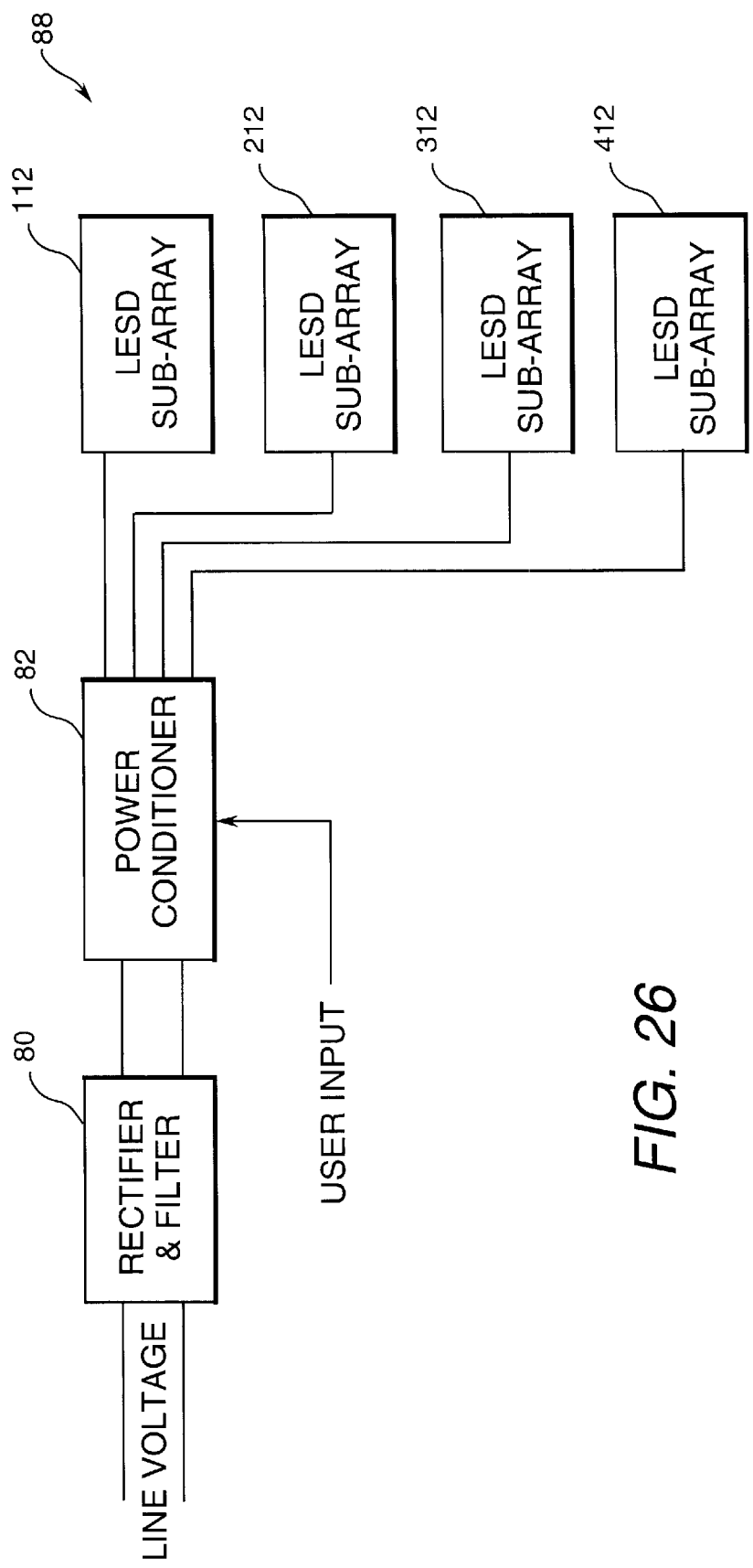

FIGS. 24–26 are simplified block diagrams of example control systems for use with the present invention. A control system can be used for selecting the manner and timing of providing the electrical power to each respective one of the LESDs. A control system may be included within a control device 20 such as shown in FIG. 1, or a control system may be situated outside the substrate. Although control systems are useful for allowing optional user input selections and/or providing thermal protection, such control systems are optional and not required by the present invention.

In a control system 84 FIG. 24, ac (alternating current) line voltage (from a 120 volt or 140 volt power supply, for example) is rectified and filtered by rectifier & filter 80 to provide dc voltage. In large applications such as factories, a lower voltage power supply than the standard 120 volts can be used to distribute electrical power. In one embodiment, a transformer (not shown) transforms the power supply voltage from 120 volts to 24 volts. A power conditioner 82 can modulate the signal to supply power to LESD array 12 at different levels in accordance with a user input selection. This can provide flexibility if an operator wants the option of buying a light source that can be dimmed and/or can be selectively used for general area illumination purposes such as room lighting, decorative lighting, or mood lighting, for example.

In a control system 86 of FIG. 25, power conditioner 82 receives un-rectified line voltage and modulates the sine wave to supply power to alternate ones of the LESDs depending on the polarity of the voltage. In this embodiment the LESDs are coupled in reverse parallel orientation as shown in FIG. 23.

In a control system 88 of FIG. 26, power conditioner 82 multiplexes power and selectively supplies it to sub-arrays 112, 212, 312, and 412.

The power conditioners of the control systems of FIGS. 25 and 26 can aide in LESD array cooling by creating a duty cycle for selectively providing power to predetermined LESDs for a set period of time and then switching the power to different ones of the LESDs. Duty cycles can be used both for controlling heat energy and for controlling the light output. For example, alternate row and column or alternate LESDs can be turned on and off per a schedule. If desired, the control system can be extended to accommodate power and/or control features such as shutters (not shown).

A control system, whether formed from active or passive electronics, can provide flexibility for the light source. For example, if old LESDs change color over time, the amount of power supplied to LESDs and/or the LESDs to which power is supplied can be varied to correct any undesired change in light or to allow the light source to be used in different forms.

The control system can also be used to affect tint control, light hue, and color shift by power modulation techniques. Additionally, phase modulation and phase array modulation in combination with a high persistence phosphor (not shown) can provide a lighting glow to remain during low cycles of the power curve.

With or without a control system, light sources of the present invention are advantageous because LESDs are rugged and unlikely to burn out. Such light sources are particularly useful in areas such as automobile dashboards and airplane cockpit display panels where bulb replacement is difficult and areas such as military helmets and automobile exteriors which experience rough conditions.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A light source comprising:

a substrate;

an array of un-packaged light emitting semiconductor devices (LESDs), each of the LESDs having at least one surface for emitting light and a substrate surface being attached to the substrate; and a plurality of electrical connections, each electrical connection coupled for providing electrical power to a respective LESD, each electrical connection including metallization patterned over a portion of at least one side surface of a respective LESD, wherein the substrate surface of each LESD includes at least one substrate surface contact pad and the substrate includes substrate contact pads, wherein the metallization extends to couple the at least one light-emitting surface and the at least one substrate surface contact pad, and wherein the at least one substrate surface contact pad is aligned with a respective one of at least one of the substrate contact pads, wherein the LESDs are arranged on the substrate with sufficient density and light generating capability to provide a predetermined irradiation from the light source.

2. The light source of claim 1 wherein the substrate includes a multilayer interconnect structure.

3. The light source of claim 1 wherein each LESD is a light emitting diode or a laser diode.

4. The light source of claim 1 wherein the substrate comprises a flexible material.

5. The light source of claim 4 wherein the substrate comprises a multilayer interconnect structure.

6. The light source of claim 1 wherein the substrate has a curved shape and wherein the array of LESDs forms a curved array.

7. The light source of claim 6 wherein the curved shape creates a convergent light pattern.

8. The light source of claim 6 wherein the curved shape creates a divergent light pattern.

9. The light source of claim 1 further including at least one reradiative component.

10. The light source of claim 9 wherein the at least one reradiative component comprises a plurality of lenses, each lens being situated over a respective one of the LESDs.

11. The light source of claim 10 wherein each lens comprises a solidified droplet of liquid lensing material.

12. The light source of claim 9 wherein the reradiative component is adapted to change the color of the light emitted by the LESDs.

13. The light source of claim 9 further including a plurality of reflector components, each reflector component being situated to reflect light from at least one respective one of the LESDs.

14. The light source of claim 3 further comprising at least one reradiative component including at least one pattern.

15. The light source of claim 14 wherein the at least one reradiative component comprises a reradiative panel.

16. The light source of claim 14 wherein the at least one reradiative component comprises at least one lens.

17. The light source of claim 3 further comprising a plurality of reflector components, each reflector component being situated to reflect light from at least one respective one of the LESDs.

18. The light source of claim 17 wherein the plurality of reflector components comprise an integral reflector component assembly.

19. The light source of claim 17 wherein the substrate includes the plurality of reflector components.

20. The light source of claim 1 wherein the light source comprises a general area illumination source.

21. The light source of claim 1 wherein the array of LESDs comprises a plurality of arrays of LESDs.

22. The light source of claim 1 wherein the substrate comprises a light-bulb-shaped substrate and further includes a base.

23. The light source of claim 1 further including a heat transfer device.

24. The light source of claim 1 further including a control system for selecting a manner and timing of providing the electrical power to each respective one of the LESDs.

* * * * *

UNITED STATES PATENT AND TRADEMARK OFFICE
CERTIFICATE OF CORRECTION

PATENT NO.     : 6,412,971 B1
DATED          : July 2, 2002
INVENTOR(S)    : Wojnarowski et al.

It is certified that error appears in the above-identified patent and that said Letters Patent is hereby corrected as shown below:

Column 10,
Beginning at line 34, the following claims were inadvertently omitted when the patent was printed and should be added:

25. The light source of claim 24 wherein the control system is responsive to an operator input selection.

26. The light source of claim 24 wherein the control system includes:

a rectifier and filter for rectifying and filtering an ac line voltage and providing a dc voltage signal; and
a power conditioner for modulating the dc voltage signal.

27. The light source of claim 24 wherein selected ones of the LESDs are coupled in reverse parallel orientation and wherein the control system includes a power conditioner for receiving ac line voltage and modulating the ac line voltage to supply power to alternate ones of the LESDs depending on the polarity of the voltage.

28. The light source of claim 24 wherein the array includes sub-arrays wherein the control system includes a power conditioner for multiplexing power and selectively supplying it to the sub-arrays.

29. The light source of claim 24 wherein the control system is adapted to select the manner and timing of providing the electrical power to each respective one of the LESDs so as to aide in LESD cooling.

Signed and Sealed this

Twelfth Day of November, 2002

*Attest:*

*Attesting Officer*

JAMES E. ROGAN
*Director of the United States Patent and Trademark Office*